United States Patent
Nam et al.

(10) Patent No.: US 7,838,196 B2
(45) Date of Patent: Nov. 23, 2010

(54) RESIST FOR SOFT MOLD AND METHOD FOR FABRICATING LIQUID CRYSTAL DISPLAY USING THE SAME

(75) Inventors: Yeon-Heui Nam, Gangwon-Do (KR); Jin-Wuk Kim, Gyeonggi-do (KR)

(73) Assignee: LG. Display Co., Ltd., Seoul (KR)

( * ) Notice: Subject to any disclaimer, the term of this patent is extended or adjusted under 35 U.S.C. 154(b) by 530 days.

(21) Appl. No.: 11/821,161

(22) Filed: Jun. 22, 2007

(65) Prior Publication Data
US 2008/0003511 A1    Jan. 3, 2008

(30) Foreign Application Priority Data
Jun. 29, 2006    (KR) .................... 10-2006-0059968

(51) Int. Cl.
G03F 7/00 (2006.01)
G03F 7/004 (2006.01)
C09K 19/00 (2006.01)

(52) U.S. Cl. .................. 430/270.1; 430/20; 430/322; 430/281.1; 428/1.1; 428/1.2

(58) Field of Classification Search ............ 430/270.1, 430/281.1, 322, 20; 428/1.1, 1.2
See application file for complete search history.

(56) References Cited

U.S. PATENT DOCUMENTS

| | | | | |
|---|---|---|---|---|
| 4,439,600 A | * | 3/1984 | Moran, Jr. ............... | 528/392 |
| 5,673,251 A | * | 9/1997 | Suzuki et al. ............ | 369/275.4 |
| 5,995,190 A | * | 11/1999 | Nagae et al. ............. | 349/156 |
| 6,582,862 B1 | * | 6/2003 | Nakamura et al. ........ | 430/7 |
| 7,168,939 B2 | * | 1/2007 | Bietsch et al. ........... | 425/385 |
| 7,198,968 B2 | * | 4/2007 | Chae et al. .............. | 438/30 |
| 7,387,971 B2 | * | 6/2008 | Chae et al. .............. | 438/759 |
| 7,401,552 B2 | * | 7/2008 | Daems et al. ............ | 101/401 |

(Continued)

FOREIGN PATENT DOCUMENTS

CN    1693974 A    11/2005

(Continued)

OTHER PUBLICATIONS

Office Action for corresponding Korean Patent Application Serial No. 10-2005-0059968, dated Dec. 14, 2007.

(Continued)

*Primary Examiner*—Amanda C. Walke
(74) *Attorney, Agent, or Firm*—Brinks Hofer Gilson & Lione

(57) ABSTRACT

A soft mold resist for soft-lithography, a method for fabricating a soft mold, and a method for fabricating a liquid crystal display (LCD) device using the same where the soft mold includes a hydrophilic liquid prepolymer, a photoinitiator; and a surface active agent. A soft mold is formed by applying the soft mold resist to a back plate or a master plate and transferring a predefined pattern from the master plate to the soft mold resist. A display is formed by applying the soft mold to an etch resist layer overlying a thin film and transferring the predefined pattern to the etch resist, then etching the thin film using the etch resist as a mask. Additional processing step are carried out to form the LCD device.

15 Claims, 6 Drawing Sheets

U.S. PATENT DOCUMENTS

| | | | |
|---|---|---|---|
| 7,501,163 B2 * | 3/2009 | Kim | 428/1.1 |
| 2004/0115558 A1 | 6/2004 | Yang et al. | |
| 2004/0229140 A1 * | 11/2004 | Kim | 430/7 |
| 2005/0084613 A1 * | 4/2005 | wang et al. | 427/282 |
| 2005/0231669 A1 | 10/2005 | Kim | |
| 2005/0264710 A1 | 12/2005 | Kim et al. | |
| 2006/0097414 A1 * | 5/2006 | Chae et al. | 264/1.27 |
| 2006/0105487 A1 | 5/2006 | Kim | |
| 2006/0131784 A1 * | 6/2006 | Sugimoto | 264/293 |
| 2006/0286699 A1 | 12/2006 | Chae et al. | |
| 2006/0290024 A1 | 12/2006 | Jo et al. | |
| 2007/0262936 A1 * | 11/2007 | Chang et al. | 345/87 |
| 2008/0000373 A1 * | 1/2008 | Petrucci-Samija et al. | 101/401.1 |
| 2008/0248205 A1 * | 10/2008 | Blanchet et al. | 427/282 |

FOREIGN PATENT DOCUMENTS

| | | |
|---|---|---|
| CN | 1710488 A | 12/2005 |
| CN | 1774672 A | 5/2006 |
| EP | 1 403 709 A2 | 3/2004 |
| GB | 2 409 574 | 6/2005 |
| GB | 2 436 007 | 9/2007 |
| GB | 2 436 009 | 9/2007 |
| JP | 2006-47975 A | 2/2006 |
| KR | 200579482 | 2/2004 |
| KR | 10-2005-0120380 | 12/2005 |
| KR | 10-2006-0045261 | 5/2006 |
| WO | WO 2004/077153 | 9/2004 |
| WO | 2005/101466 A2 | 10/2005 |
| WO | WO 2007117107 A1 * | 10/2007 |

OTHER PUBLICATIONS

Combined Search and Examination Report for corresponding United Kingdom Patent Application Serial No. 0712298.9, dated Oct. 25, 2007.

First Page of the Office Action issued in corresponding Japanese Patent Application No. 2007-171037; issued Nov. 9, 2009.

Office Action issued in corresponding Chinese Patent Application No. 200710126891.5; issued Sep. 18, 2009.

* cited by examiner

RESIST FOR SOFT MOLD AND METHOD FOR FABRICATING LIQUID CRYSTAL DISPLAY USING THE SAME

PRIORITY CLAIM

This application claims the benefit of Korean Patent Application No. 59968/2006, filed Jun. 29, 2006, which is incorporated by reference herein.

TECHNICAL FIELD

The present invention relates to a resist for a soft mold (namely, resistive pattern) used for soft-lithography and a method for fabricating a liquid crystal display (LCD) device using the same.

BACKGROUND

Description of the Related Art

Recently, the importance of a display device as a visual information transmission medium has increased, and various types of competitive display devices are being developed. In order to hold an important position, the display devices should meet the requirements of having a low power consumption, being thin and light, and having high picture quality.

An LCD, a major product among the flat panel displays (FPDs), can be mass produced and still have the performance necessary to satisfy the expectations of the display market. LCDs can be commonly employed in various application fields such as a large TV or a computer monitor, or the like. and is taking hold as a core display device that may eventually replace the existing cathode ray tubes (CRTs) in the market place.

The LCD is a display device in which data signals according to image information are individually supplied to liquid crystal cells arranged in a matrix form to control light transmittance of the liquid crystal cells to thus display desired images.

The construction of the related art LCD will now be described.

FIG. 1 is an exploded perspective view showing the construction of a related art LCD.

As shown, the general LCD includes a color filter substrate 113, a TFT array substrate 101, and a liquid crystal layer 109 formed between the color filter substrate 113 and the array substrate 101.

The color filter substrate 113 includes a color filter 117 including a plurality of sub-color filters that implement red, green and blue colors, a black matrix 115 for dividing the sub-color filters and blocking light transmission through the liquid crystal layer 109, and a transparent common electrode 111 for applying voltage to the liquid crystal layer 109.

The array substrate 101 includes a plurality of gate lines 103 and a plurality of data lines 105 which are arranged vertically and horizontally to define a plurality of pixel regions (P), TFTs, switching elements, formed at respective crossings of the gate lines 103 and the data lines 105, and pixel electrodes 107 formed on the pixel regions (P).

In the method for fabricating most of the flat panel display devices including the LCD, a thin film material stacked on the substrate is patterned by using a photolithography process. The photolithography process is a type of photo-etching process and the patterning method using the photolithography process is as follows.

First, a photoresist, such as a photosensitive material, is coated on a thin film to be patterned, a photo mask with a certain pattern is aligned, and an exposing process is performed. In this case, the photo mask includes a certain transmission region and a blocking region, and light which has transmitted through the transmission region chemically changes the photoresist.

The chemical change of the photoresist varies depending on the type of the photoresist. In case of a positive photoresist, its light-exposed portion is changed to have qualities dissolved by a developer, and in the case of a negative photoresist, its light-exposed portion is changed to have qualities that are not dissolved by the developer. A process using a positive photoresist is taken as an example in the following description.

Following the exposing process, when the exposed portion of the photoresist is removed using a developer, a certain photoresist pattern is formed on the thin film. Thereafter, the thin film is etched according to the shape of the photoresist pattern and a remaining photoresist pattern is removed to form a certain shape of thin film pattern. Thus, the photolithography process requires a high-priced photomask and is a complicated processes involving exposing and developing processes that result in high processing costs and low production yield.

SUMMARY

In one aspect, a soft mold includes a hydrophilic liquid prepolymer of 96 wt % or greater, a photoinitiator of about 1 wt % to 3 wt %; and a surface active agent of about 0.01 wt % to 1 wt %.

In a second aspect, a method of fabricating a soft mold includes providing a master plate having depressed or embossed portions. A resin layer containing a hydrophilic liquid prepolymer of 96 wt % or greater, a photoinitiator of about 1 wt % to 3 wt %, and a surface active agent of about 0.01 wt % to 1 wt % is coated on the master plate. The resin layer is cured by irradiating ultraviolet (UV) light to the resin layer. The cured resin layer is detached from the master plate, wherein the soft mold comprises the cured resin layer.

In a third aspect, a method of forming a pattern using a soft mold includes forming a thin film on a substrate. A resist is applied to the thin film on the substrate. A soft mold is disposed on the resist. The soft mold includes at least one depressed pattern and has a hydrophilic property. The soft mold is removed from the substrate to form at least one desired pattern on the substrate.

In a fourth aspect, a method for forming a liquid crystal display (LCD) device using a soft mold includes providing a first substrate and a second substrate. A black matrix is formed on the first substrate. A color filter is formed on the black matrix. An overcoat and column spacers is patterned with a soft mold. The soft mold has a hydrophilic property. A gate electrode is formed on the second substrate. A gate insulating layer is formed on the gate electrode. A TFT including a source electrode, a drain electrode, an active pattern, and a semiconductor layer is formed on the second substrate. A passivation layer and pixel electrode are formed on the second substrate. A liquid crystal layer is disposed between the first substrate and the second substrate. The first substrate is attached with the second substrate.

The foregoing and other objects, features, aspects and advantages of the present invention will become more apparent from the following detailed description of the present invention when taken in conjunction with the accompanying drawings.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

The resist for a soft mold and a method for fabricating a liquid crystal display (LCD) device using the same according to the exemplary embodiments of the present invention will now be described with reference to the accompanying drawings.

Figure 1:
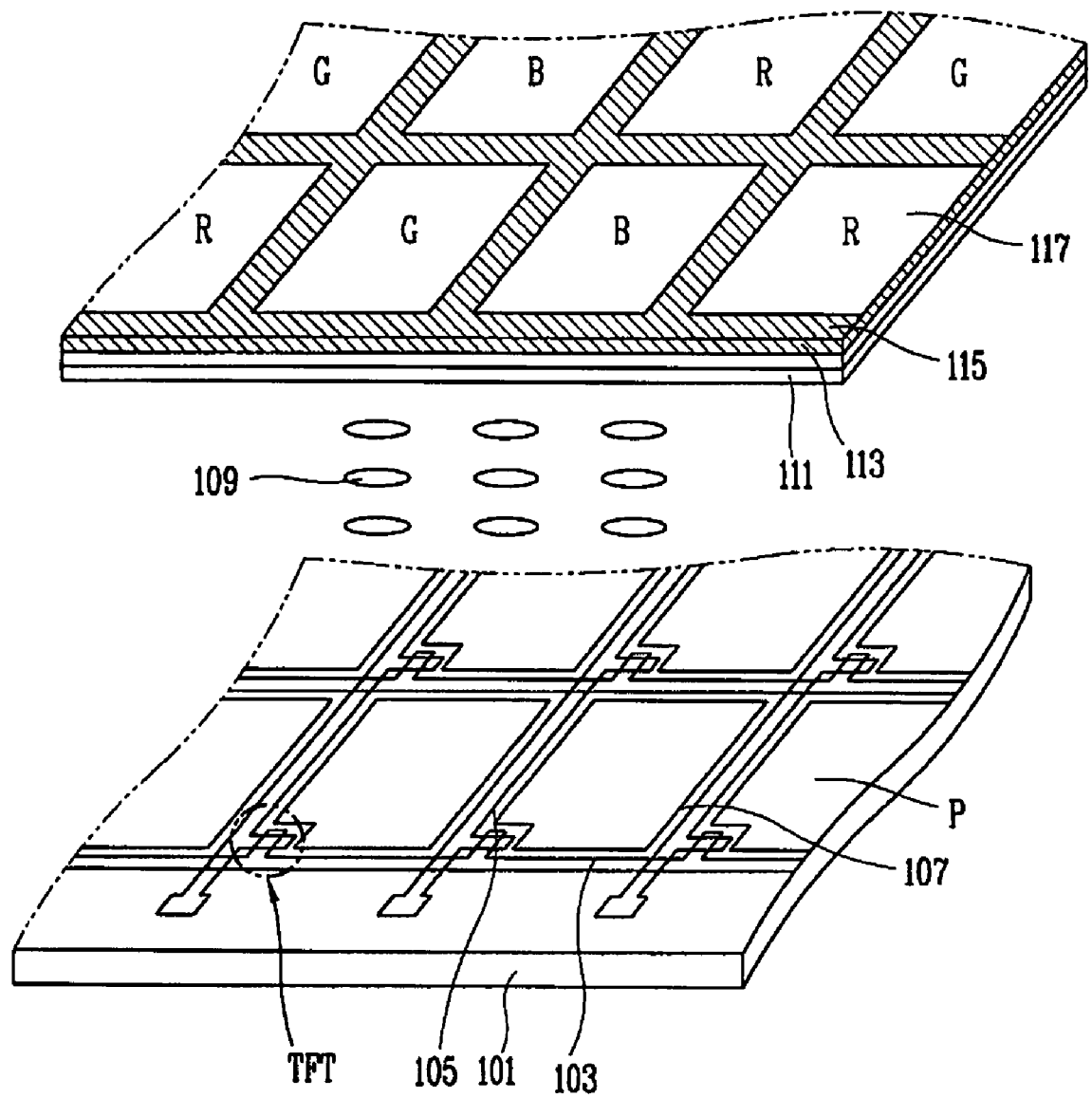
FIG. 1 is an exploded perspective view showing the structure of a related art liquid crystal display.
Figure 2A:
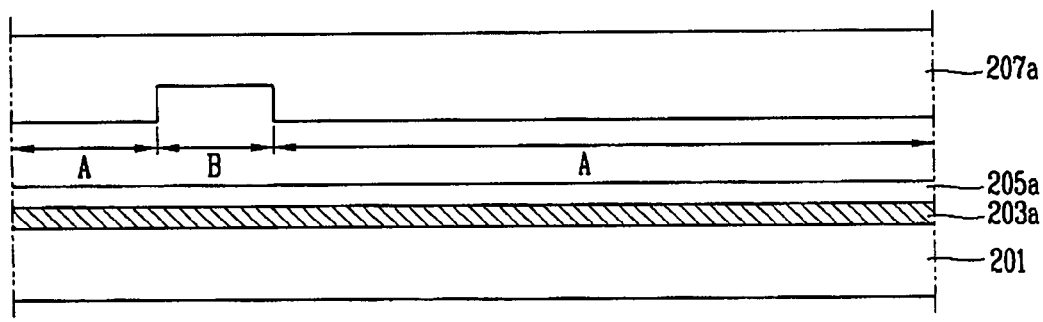
FIGS. 2A to 2C are sectional views sequentially showing a method for patterning a thin film according to an exemplary embodiment of the present invention.
Figure 2B:
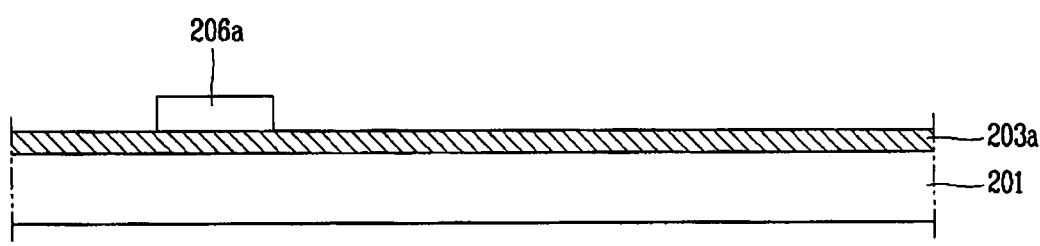
Figure 2C:
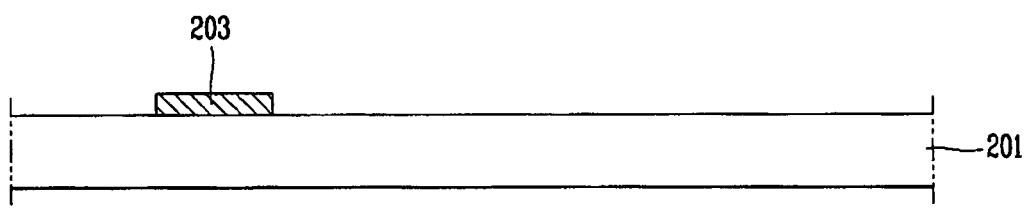

FIGS. 2A to 2C are sectional views sequentially showing a method for patterning a thin film according to the exemplary embodiment of the present invention. Specifically, FIGS. 2A to 2C show a method for patterning a thin film by using soft-lithography which allows formation of a pattern without using a photolithography process.

As shown in FIG. 2A, a thin film 203a is formed on a substrate 201, on which an etch resist 205a is then formed with a liquid resin.

Thereafter, a soft mold 207a including a depressed pattern (B) and an embossed pattern (A) is brought into contact with a surface of the etch resist 205a from above the substrate 201 on which the thin film 203a and the etch resist 205a are formed. In this case, the soft mold 207a can be formed by curing a resist for a soft mold.

When the soft mold 207a contacts the surface of the etch resist 205a that corresponds to a portion where a pattern is to be formed, the etch resist 205a, which is a liquid resin, transfers to the depressed pattern (B) of the soft mold 207a by virtue of a capillary action and the high surface energy of the soft mold 207a. In this case, the soft mold 207a is pressed when it contacts with the surface of the etch resist 205a as necessary.

After a certain amount of time lapses, the soft mold 207a is separated from the substrate 201. Then, as shown in FIG. 2B, an etch resist pattern 206a in the same shape as the depressed pattern (B) remains on the thin film 203a. A certain amount of etch resist may remain at other portions in addition to the etch resist pattern 206a, and in this case, an ashing process can be performed to remove the remaining etch resist.

Next, as shown in FIG. 2C, the thin film 203a is selectively etched by using the etch resist pattern 206a as a mask, and then the etch resist pattern 206a is removed to form a certain thin film pattern 203.

As mentioned above, the soft photolithography process according to the present invention includes the process of allowing the etch resist and the soft mold to contact with each other to form the etch resist pattern. In this case, the etch resist transfers to the depressed pattern of the soft mold pattern to form the etch resist pattern corresponding to the pattern formed at the soft mold pattern.

In this respect, however, if the repulsive force is strong between the etch resist and the surface of the soft mold, namely, if adhesion between the etch resist and the soft mold is weak because of a low surface energy of the soft mold, the etch resist will not sufficiently transfer to the depressed pattern of the soft mold, making it difficult to form the etch resist pattern. In subsequent processes that use the etch resist pattern, the etch resist pattern will not be properly formed in the underlying layers. Thus, it is necessary to improve the adhesion between the soft mold and the etch resist, and with improved adhesion, contact between the two materials can be improved and it is possible to form a high quality pattern.

The adhesion and spreading characteristics between the two contacting materials depend on the surface energy, and the stronger the surface energy of the soft mold, the better the adhesion and spreading characteristics with the etch resist. In addition, the adhesion between the two materials depends on hydrophilicity of the two materials, and the more a material has hydrophilicity, the more the adhesion increases. In contrast, the higher the hydrophobicity of the material, the more the adhesion decreases.

Thus, in the exemplary embodiment of the present invention, a soft mold with hydrophilicity and high surface energy is formed by using a photocurable (UV curable) material and an LCD is fabricated by using the soft mold.

FIGS. 3A to 3E are sectional views sequentially showing a method for fabricating a soft mold according to a first exemplary embodiment of the present invention.

Figure 3A:
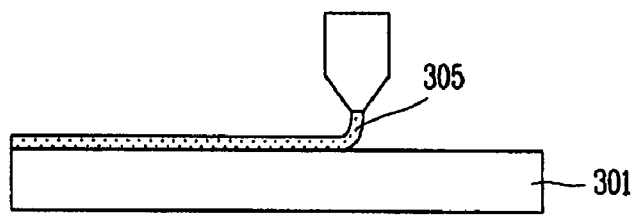
FIGS. 3A to 3E are sectional views sequentially showing a method for fabricating a soft mold according to one exemplary embodiment of the present invention.

As shown in FIG. 3A, a resist 305 for a soft mold is coated to form a soft mold on a substrate 301. In this case, the material for forming the soft mold is a UV curable liquid material for forming a pattern, which will be called a resist for a soft mold hereinafter.

The substrate 301 can be made of glass or PET (Polyethylene Terephthalate).

Figure 3B:
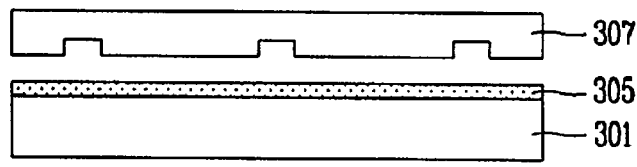
Figure 3C:
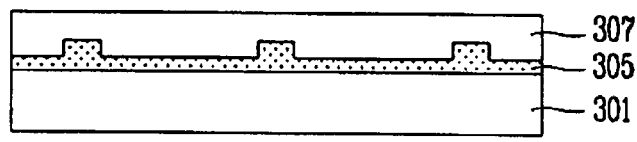

Next, as shown in FIGS. 3B and 3C, a master plate 307 with a certain pattern formed at a region corresponding to a pattern desired to be formed on the soft mold is prepared and allowed to contact with an upper surface of the resist 305. In this case, the resist 305 can be pressed or heated to increase its mobility, as necessary.

The master plate 307 includes a certain pattern such as a depressed pattern or an embossed pattern formed on the master plate 307. The master plate 307 can be a glass plate or a glass plate with a metal formed thereon. Alternatively, the master plate 307 may be a flexible plate, such as plastic, or may be a flexible plate with a metal formed thereon. The material for forming the certain pattern can be made of one of a metal, silicon oxide/silicon nitride, photoresist, and wax.

When the master plate 307 contacts with the resist 305, the resist 305, which is in a liquid state, transfers to the depressed pattern of the master plate 307.

Figure 3D:
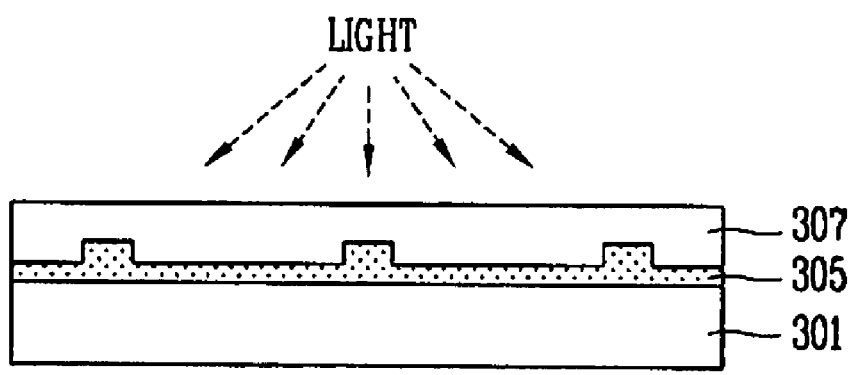

Next, as shown in FIG. 3D, the resist 305 is cured by exposure to light to create a soft mold. The resist 305, according to an exemplary embodiment of the present invention, is a material that can be cured when light is irradiated thereto. In a preferred embodiment, the resist 305 is cured using ultraviolet light having a wavelength of about 300 nm~500 nm.

Figure 3E:
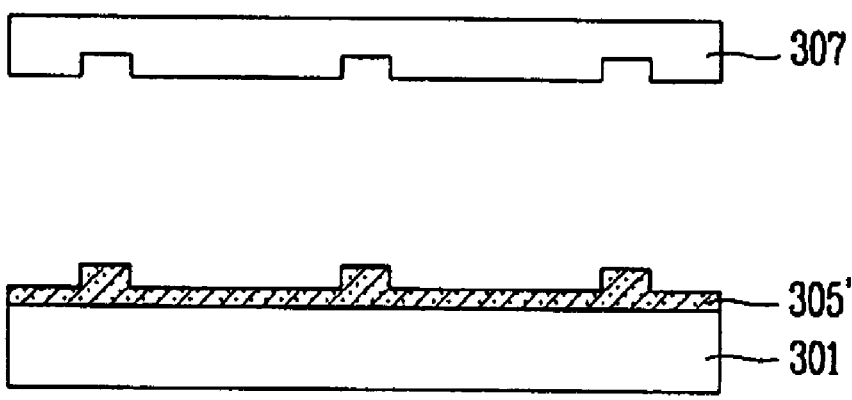

As shown in FIG. 3E, after a soft mold 305' is formed, the master plate 307 is separated from the substrate 301.

FIGS. 4A to 4E are sectional views sequentially showing a method for fabricating a soft mold according to another exemplary embodiment of the present invention.

Figure 4A:
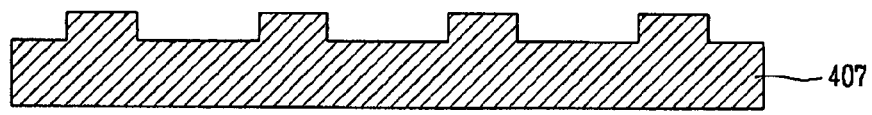
FIGS. 4A to 4E are sectional views sequentially showing a method for fabricating a soft mold according to another exemplary embodiment of the present invention.

First, as shown in FIG. 4A, a master plate 407 with a certain pattern formed at a region corresponding to a pattern desired to be formed on the soft mold is prepared.

As mentioned above, the master plate 407 includes a certain pattern such as a depressed pattern or an embossed pattern formed on the master plate 407. The master plate 407 can be a glass plate or a glass plate with a metal formed thereon. Alternatively, the master plate 407 may be a flexible plate, such as plastic, or may be a flexible plate with a metal formed thereon. The material for forming the certain pattern can be made of one of a metal, silicon oxide/silicon nitride, photoresist, organic material and wax.

Figure 4B:
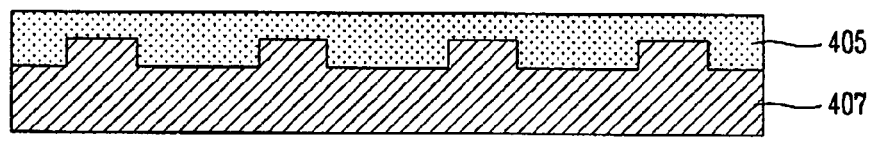

Thereafter, as shown in FIG. 4B, a resin layer 405 for forming a soft mold is coated on the master plate 407 by using a spin coating or the like. In this case, the material for forming a soft mold can be a UV curable liquid material for forming a pattern.

Figure 4C:
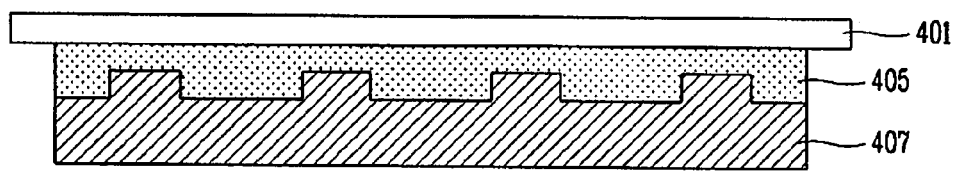

Next, as shown in FIG. 4C, a back plane 401 is brought into contact with an upper surface of the resin layer 405. In this case, if necessary, a certain attachment material (not shown) can be interposed between the resin layer 405 and the back plane 401.

The back plane 401 can be made of glass or PET (Polyethylene Terephthalate), or the like.

Figure 4D:
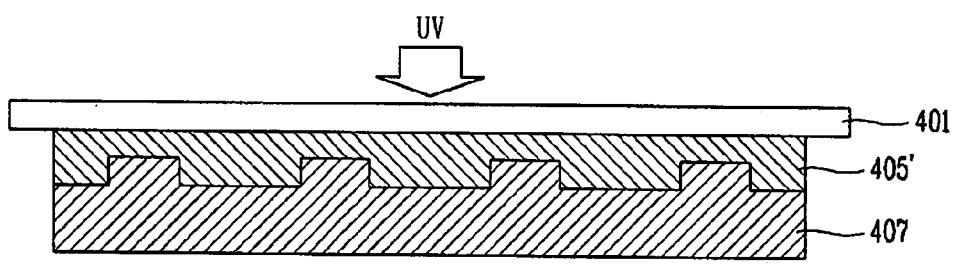

Next, as shown in FIG. 4D, light is irradiated through the back plane 401 to cure the resin layer 405 and to form a soft mold 405'.

Similar to the exemplary embodiment described above, the resist material for resin layer 405 according to the instant embodiment, is a material that can be cured when light is irradiated thereto. The resin layer 405 is preferably cured using ultraviolet light having a wavelength of about 300 nm~500 nm.

Figure 4E:
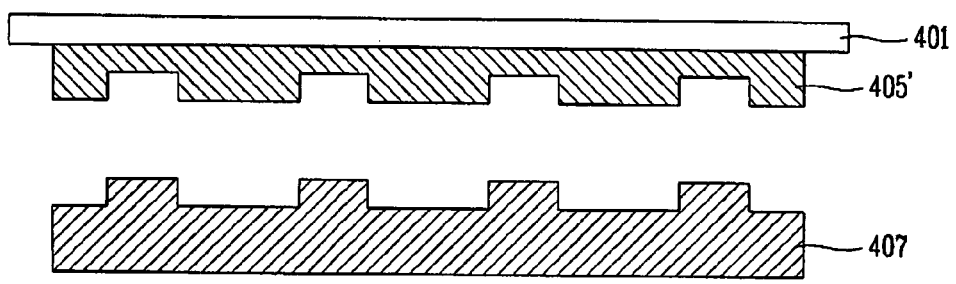

As shown in FIG. 4E, after soft mold 405' is formed, the master plate 407 is separated from the back plane 401.

Preferably, the pattern forming resist is in a liquid state assuming UV curability. In addition, the pattern forming resist preferably has hydrophilicity in order to better contact characteristics with an etch resist in forming a pattern in the LCD or the like.

The material of the soft mold, namely, the resist for the soft mold according to the present invention includes a hydrophilic liquid prepolymer of about 96 wt % or greater; a photoinitiator of about 1 wt % to 3 wt %; and a surface active agent of about 0.01 wt % to 1 wt %, and is a material that can be cured when light is irradiated thereto. In one embodiment, the hydrophilic liquid prepolymer of may be 98 wt %; the photoinitiator may be 1.5 wt %; and the surface active agent may be 0.5 wt %.

The hydrophilic liquid prepolymer is a prepolymer that can be UV cured and includes acrylate prepolymer. The acrylate prepolymer includes an HEA (2-Hydroxyethyl Acrylate), EGDMA (Ethyleneglycol Dimethacrylate), EGPEA (Ethyleneglycol Phenyltheracrylate), HPA (Hydroxypropyl Acrylate), and HPPA (Hydroxyphenoxypropyl Acrylate), and the like, and includes a hydrophilic acrylate prepolymer that can be UV cured.

In the soft mold material, one prepolymer can be used, or alternatively, two or more prepolymers can be mixed to be used, as necessary.

The photoinitiator is a material that forms a radical upon receiving light to start polymerization, including "Irgacure 369," "Irgacure 184," "Irgacure 819," and the like, available from Ciba Speciality Chemicals. [note the chemical composition should be described and claimed] In the soft mold material, one photoinitiator can be used, or alternatively, several can be mixed as necessary.

The surface active agent is added to change the surface tension or the surface energy. A preferred surface active agent is "FSO-100" available from DuPont Corporation. [note the chemical composition should be described and claimed]

When the resist for a soft mold according to the present invention is exposed to light, a light-induced reaction occurs in which the photoinitiator forms a radical, whereby the resist is polymerized and cured. In particular, the resist is cured by the light irradiation thereon and molded, and, as described above, UV light of about 300 nm~500 nm can be used to cure the resist.

The thin film patterning process using the resist for a soft mold can be used in a process for forming a color filter or a black matrix, or an overcoat layer including a column spacer. In addition, the thin film patterning process using the resist for a soft mold can be also used in a process for fabricating an OLED (Organic Light Emitting Diode) or other flat plane display devices, as well as an LCD device.

The resist for a soft mold and the method for fabricating an LCD by using the soft mold fabrication method will be described as follows.

The process for fabricating the liquid crystal display panel can be divided into a driving element array process for forming a driving element on the lower array substrates, a color filter process for forming a color filter on the upper color filter substrate, and a cell process.

First, a plurality of gate lines and a plurality of data lines arranged to define pixel regions on the array substrate are formed, and a TFT, a driving element, is formed to be connected with the gate lines and the data lines at each of the pixel regions through the array process. In addition, a pixel electrode which is connected with the TFT and drives the liquid crystal layer as a signal is applied thereto through the TFT is formed through the array process.

Figure 5A:
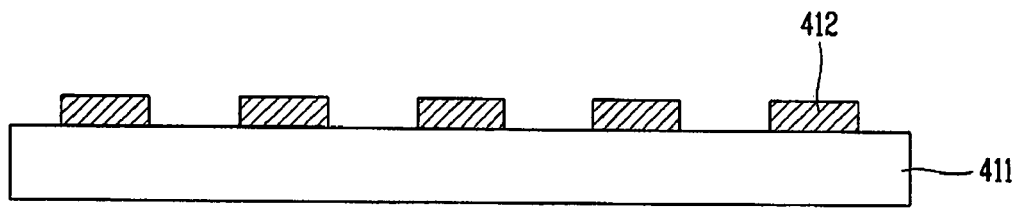
FIGS. 5A to 5C are sectional views sequentially showing a method for fabricating an overcoat layer including a column spacer using the soft mold according to another exemplary embodiment of the present invention.
Figure 5B:
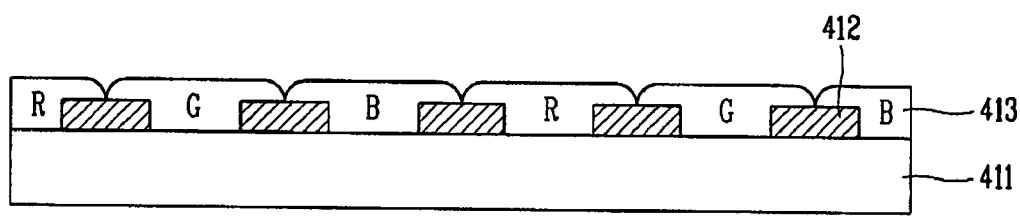
Figure 5C:
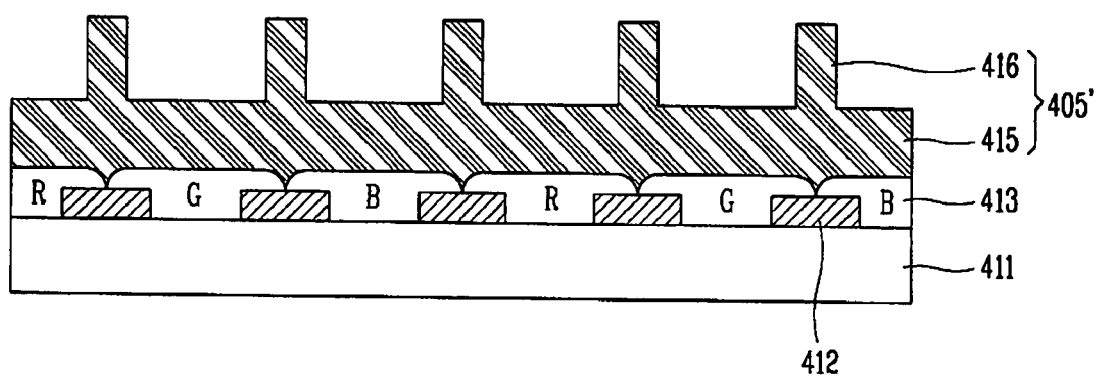

A black matrix 412 for discriminating sub-color filters and shielding light passing a liquid crystal layer and a color filter layer 413 comprising red, green and blue sub-color filters implementing colors are formed on the color filter substrate 411 through the color filter process as shown in FIGS. 5A to 5C. And then, an overcoat layer 415 including column spacers 416 may be formed on the color filter substrate 411.

In this case, the pattern of the overcoat layer 415 including the column spacers 416 may be formed by using the soft mold 405' and the soft mold fabrication method according to the present invention.

Namely, for example, in order to form the pattern such as the overcoat layer 415 including the column spacers 416 on the color filter substrate 411, a master plate (not shown) with a certain pattern formed at a region corresponding to a pattern desired to be formed on the soft mold 405' is prepared.

Thereafter, a certain thin film such as a resin layer for forming the soft mold 405' is formed on the master plate by using a spin coating or the like. In this case, the resin layer for forming the soft mold 405' may be a UV curable liquid material containing a hydrophilic liquid prepolymer of about 96 wt % or greater; a photoinitiator of about 1 wt % to 3 wt %; and a surface active agent of about 0.01 wt % to 1 wt %.

Next, the color filter substrate 411 with the black matrix 412 and color filter layer 413 formed thereon is brought into contact with an upper surface of the resin layer. In this case, if necessary, a certain attachment material may be interposed between the resin layer and the color filter substrate 411.

And then, light is irradiated through the color filter substrate 411 to cure the resin layer and to form the soft mold 405'.

After the soft mold 405' is formed, the master plate is separated from the color filter substrate 411. Then, the overcoat layer 415 including column spacers 416 is formed on the color filter substrate 411.

Subsequently, after alignment films are coated on the array substrate and the color filter substrate, they are aligned to provide an anchoring force or a surface fixing force (namely, a pretilt angle and an alignment direction) to liquid crystal molecules of a liquid crystal layer formed between the array substrate and the color filter substrate.

After finishing the aligning process, spacers are formed to uniformly maintain a cell gap between the array substrate and the color filter substrate, a sealant is coated on an outer edge portion of the color filter substrate, and then, the array substrate and the color filter substrate are attached by pressing the substrates together.

The array substrate and the color filter substrate are large-scale mother substrates. In other words, a plurality of panel regions are formed on the large-scale mother substrates, and the TFT, the driving element, and the color filter layer are formed on each panel region, so in order to fabricate unit liquid crystal panels, the mother substrates should be cut and processed.

The liquid crystal is injected by using a vacuum injection method using a pressure difference. That is, according to the vacuum injection method, the liquid crystal injection opening of the unit liquid crystal display panel separated from the large-scale mother substrates is put in a container filled with liquid crystal in a chamber with a certain degree of vacuum, and then, the degree of vacuum is changed to allow liquid crystal to be injected into the interior of the liquid crystal display panel according to a pressure difference between the interior and the exterior of the liquid crystal display panel. When the liquid crystal is filled within the liquid crystal display panel, the liquid crystal injection opening is sealed to form the liquid crystal layer of the liquid crystal display panel. Thus, in order to form the liquid crystal layer at the liquid crystal display panel through the vacuum injection method, a portion of the seal pattern needs to be opened to serve as the liquid crystal injection opening.

Where a dropping method is used to form the liquid crystal layer, after finishing the aligning process, a seal pattern is formed with a sealant on the color filter substrate and at the same time liquid crystal is dropped to the array substrate.

According to the dropping method, after liquid crystal is dropped and dispensed on image display regions of the large-scale first mother substrate where a plurality of array substrates are disposed or on image display regions of the second mother substrate where the plurality of color filter substrates are disposed, the first and second mother substrates are attached by applying a certain pressure thereto to thereby make the liquid crystal uniformly distributed to the entire image display regions to thus form a liquid crystal layer.

Thus, in the case where the liquid crystal layer is formed in the liquid crystal display panel through the dropping method, the seal pattern should be formed as a closed pattern surrounding the outer edges of pixel part regions in order to prevent a leakage of liquid crystal to outside of the image display regions.

The dropping method allows dropping of liquid crystal within a relatively short time compared with the vacuum injection method and can quickly form the liquid crystal even when the liquid crystal display panel is large.

In addition, because the only required amount of liquid crystal is dropped on the substrate, such an increase in the unit cost of the liquid crystal display panel according to discarding of the high-priced liquid crystal as in the vacuum injection method can be prevented, and thus, the price competitiveness of the product can be enhanced.

Thereafter, in a state that the array substrate and the color filter substrate on which liquid crystal has been dropped and the sealant has been coated are aligned, pressure is applied thereto to attach the array substrate and the color filter using the sealant and at the same time the dropped liquid crystal is spread uniformly on the entire portion of the panel.

In the fabrication process, the plurality of liquid crystal panels with the liquid crystal layer formed therein are formed from the large-scale mother substrates. The glass substrates are processed and cut separate them into a plurality of liquid crystal panels, which are then inspected to thereby finish the fabrication of the liquid crystal display panels.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

The invention claimed is:

1. A method of fabricating a soft mold, comprising:
providing a master plate having depressed or embossed portions formed at a region corresponding to a pattern desired to be formed on a soft mold;
coating a hydrophilic resist material containing an acrylate prepolymer of 96 wt % or greater, a photoinitiator of about 1 wt % to 3 wt %, and a surface active agent of about 0.01 wt % to 1 wt % on the master plate;
attaching a back-plane including an attachment material to the hydrophilic resist material such that the attachment material contacts the hydrophilic resist material after coating the hydrophilic resist material on the master plate;
curing the hydrophilic resist material by irradiating ultraviolet (UV) light to the hydrophilic resist material; and
detaching the cured hydrophilic resist material from the master plate, wherein the soft mold comprises the cured hydrophilic resist material.

2. The method according to claim 1, wherein the resist material comprises:
an acrylate prepolymer of 98 wt;
a photoinitiator of about 1.5 wt %; and
a surface active agent of about 0.5 wt %.

3. The method according to claim 2, wherein the acrylate prepolymer comprises one or more of HEA (2-Hydroxyethyl Acrylate), EGDMA (Ethyleneglycol Dimethacrylate), EGPEA (Ethyleneglycol Phenyltheracrylate), HPA (Hydroxypropyl Acrylate), or HPPA (Hydroxyphenoxypropyl Acrylate).

4. The method according to claim 1, wherein the UV light has a wavelength of 300 nm to 500 nm.

5. The method according to claim 1, wherein the acrylate prepolymer comprises one or more of HEA (2-Hydroxyethyl Acrylate), EGDMA (Ethyleneglycol Dimethacrylate), EGPEA (Ethyleneglycol Phenyltheracrylate), HPA (Hydroxypropyl Acrylate), or HPPA (Hydroxyphenoxypropyl Acrylate).

6. A method of forming a pattern using a soft mold comprising:
forming a thin film on a substrate;
applying a photoresist to the thin film on the substrate;

providing a master plate having depressed or embossed portions formed at a region corresponding to a pattern desired to be formed on a soft mold;

coating a hydrophilic resist material containing an acrylate prepolymer of 96 wt % or greater, a photoinitiator of about 1 wt % to 3 wt %, and a surface active agent of about 0.01 wt % to 1 wt % on the master plate;

attaching a back-plane including an attachment material to the hydrophilic resist material such that the attachment material contacts the hydrophilic resist material after coating the hydrophilic resist material on the master plate;

curing the hydrophilic resist material by irradiating ultra-violet (UV) light to the hydrophilic resist material;

detaching the cured hydrophilic resist material from the master plate, wherein the soft mold comprises the cured hydrophilic resist material;

disposing the hydrophilic soft mold on the photoresist, wherein the; and removing the hydrophilic soft mold from the substrate to form at least one desired pattern on the substrate.

7. The method of claim 6, wherein the light-cured hydrophilic soft mold comprises:

an acrylate prepolymer of 98 wt %;

a photoinitiator of about 1.5 wt %; and a surface active agent of about 0.5 wt %.

8. The method of claim 7, wherein the acrylate prepolymer comprises one or more of HEA (2-Hydroxyethyl Acrylate), EGDMA (Ethyleneglycol Dimethacrylate), EGPEA (Ethyleneglycol Phenyltheracrylate), HPA (Hydroxypropyl Acrylate), or HPPA (Hydroxyphenoxypropyl Acrylate).

9. The method of claim 6, wherein the acrylate prepolymer comprises one or more of HEA (2-Hydroxyethyl Acrylate), EGDMA (Ethyleneglycol Dimethacrylate), EGPEA (Ethyleneglycol Phenyltheracrylate), HPA (Hydroxypropyl Acrylate), or HPPA (Hydroxyphenoxypropyl Acrylate).

10. The method of claim 6 further comprising:

curing the photoresist with light to form at least one photoresist pattern corresponding to the at least one depressed pattern;

etching the thin film with the at least one photoresist pattern as a mask leaving the at least one desired pattern of the thin film, the at least one desired pattern corresponding to the at least one photoresist pattern; and removing the at least one photoresist pattern leaving the at least one desired pattern on the substrate.

11. The method of claim 10 wherein the at least one desired pattern on the substrate comprises an overcoat layer and column spacers, wherein the column spacers are configured to separate the substrate and a second substrate.

12. The method of claim 10 wherein the overcoat layer and the column spacers comprise a singular structure.

13. A method for forming a liquid crystal display (LCD) device using a soft mold comprising:

providing a first substrate and a second substrate;

forming a black matrix on the first substrate;

forming a color filter on the black matrix;

patterning an overcoat and column spacers with a light-cured hydrophilic soft mold, wherein the light-cured hydrophilic soft mold includes an acrylate prepolymer of 96 wt % or greater, a photoinitiator of about 1 wt % to 3 wt % and a surface active agent of about 0.01 wt % to 1 wt %;

forming a gate electrode on the second substrate;

forming a gate insulating layer on the gate electrode;

forming a TFT including a source electrode, a drain electrode, an active pattern, and a semiconductor layer on the second substrate;

forming a passivation layer on the second substrate;

forming a pixel electrode on the second substrate;

disposing a liquid crystal layer between the first substrate and the second substrate; and attaching the first substrate with the second substrate.

14. The method of claim 13, wherein the light-cured hydrophilic soft mold comprises:

an acrylate prepolymer of 98 wt %;

a photoinitiator of about 1.5 wt %; and a surface active agent of about 0.5 wt %.

15. The method of claim 14, wherein the acrylate prepolymer is a hydrophilic acrylate prepolymer including one or more of HEA (2-Hydroxyethyl Acrylate), EGDMA (Ethyleneglycol Dimethacrylate), EGPEA (Ethyleneglycol Phenyltheracrylate), HPA (Hydroxypropyl Acrylate), or HPPA (Hydroxyphenoxypropyl Acrylate).

* * * * *